United States Patent
Uppala

(10) Patent No.: US 7,756,464 B2
(45) Date of Patent: Jul. 13, 2010

(54) ALTERNATE RADIO CHANNEL SELECTION ADAPTED PER USER PATTERNS

(75) Inventor: Srikanth Uppala, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 492 days.

(21) Appl. No.: 11/761,656

(22) Filed: Jun. 12, 2007

(65) Prior Publication Data

US 2008/0311940 A1 Dec. 18, 2008

(51) Int. Cl.
H04H 20/71 (2008.01)
H04B 17/02 (2006.01)

(52) U.S. Cl. .................. 455/3.01; 455/3.04; 455/134

(58) Field of Classification Search ............. 455/3.01, 455/3.02, 3.04, 3.06, 134, 135, 152.1, 150.1, 455/151.2, 509
See application file for complete search history.

(56) References Cited

U.S. PATENT DOCUMENTS

| | | | |
|---|---|---|---|
| 5,390,343 A * | 2/1995 | Rupprecht et al. | 455/161.3 |
| 5,428,825 A * | 6/1995 | Tomohiro et al. | 455/186.1 |
| 6,961,548 B2 * | 11/2005 | Groeger et al. | 455/161.1 |
| 7,447,488 B2 * | 11/2008 | Howard et al. | 455/179.1 |
| 7,502,589 B2 * | 3/2009 | Howard et al. | 455/3.06 |
| 2008/0160928 A1 * | 7/2008 | Tsfaty et al. | 455/77 |

OTHER PUBLICATIONS

"The new RDS IEC 62106:1999 standard", RDS Forum; International Electrotechnical Commission; Geneva, Switzerland, (Dec. 1999), 132 pages.

* cited by examiner

*Primary Examiner*—Sonny Trinh
(74) *Attorney, Agent, or Firm*—Fiala & Weaver P.L.L.C.

(57) ABSTRACT

Methods, systems, and apparatuses for selecting alternate channels for broadcast radio channels, and for tracking alternate channel selections, are provided. Some radio systems provide alternate frequencies for tuned radio frequencies to use when the tuned radio frequency signal is no longer receivable. In aspects of the present invention, historical information is generated from alternate channel switching attempts. In further aspects, the generated historical information is used to aid in making a subsequent switch to an alternate channel.

27 Claims, 8 Drawing Sheets

500

502
a first modulated RF signal representing a first channel having a first carrier frequency and a list of alternate channels for the first carrier frequency is received in a first coverage area

504
the receiver is moved to a second coverage area

506
a modulated RF signal in the second coverage area is attempted to be received using at least one new channel selected from the list of alternate channels

508
historical information is generated regarding the attempt to receive a modulated RF signal using at least one new channel in the second coverage area

FIG. 5

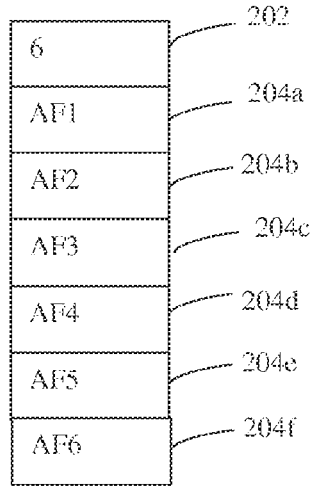

FIG. 6

| | | |
|---|---|---|
| TF1 | AF1 | 0 |
| TF1 | AF2 | 0 |
| TF1 | AF3 | 0 |
| TF1 | AF4 | 0 |
| TF1 | AF5 | 0 |
| TF1 | AF6 | 0 |

800

| 802 | 804 | 806 |
|---|---|---|
| TF1 | AF1 | 0 |
| TF1 | AF2 | 100 |
| TF1 | AF3 | 0 |
| TF1 | AF4 | 0 |
| TF1 | AF5 | 0 |
| TF1 | AF6 | 0 |

| | |
|---|---|
| 6 | — 202 |
| AF1 | — 204a |
| AF3 | — 204b |
| AF4 | — 204c |
| AF5 | — 204d |
| AF6 | — 204e |
| AF7 | — 204f |

| 802 | 804 | 1202 | 1204 | 806 | |
|---|---|---|---|---|---|
| TF1 | AF1 | 200 | 0 | 0 | 808a |
| TF1 | AF2 | 200 | 160 | 80 | 808b |
| TF1 | AF3 | 200 | 40 | 20 | 808c |
| TF1 | AF4 | 200 | 0 | 0 | 808d |
| TF1 | AF5 | 200 | 0 | 0 | 808e |
| TF1 | AF6 | 200 | 0 | 0 | 808f |
| TF2 | AF1 | 160 | 0 | 0 | 808g |
| TF2 | AF3 | 160 | 0 | 0 | 808h |
| TF2 | AF4 | 160 | 0 | 0 | 808i |
| TF2 | AF5 | 160 | 0 | 0 | 808j |
| TF2 | AF6 | 160 | 160 | 100 | 808k |
| TF2 | AF7 | 160 | 0 | 0 | 808l |
| TF3 | AF1 | 40 | 0 | 0 | 808m |
| TF3 | AF3 | 40 | 0 | 0 | 808n |
| TF3 | AF4 | 40 | 0 | 0 | 808o |
| TF3 | AF5 | 40 | 0 | 0 | 808p |
| TF3 | AF6 | 40 | 40 | 100 | 808q |
| TF3 | AF7 | 40 | 0 | 0 | 808r |

| 802 | 804 | 1202 | 1204 | 806 | 1302 | 1304 | 1306 | 1308 | |
|---|---|---|---|---|---|---|---|---|---|
| TF1 | AF1 | 200 | 0 | 0 | | | | | 808a |
| TF1 | AF2 | 200 | 160 | 80 | 8:00a | M, Tu | WD | Irv. | 808b |
| TF1 | AF3 | 200 | 40 | 20 | 9:00a | Sat | WE | SD | 808c |
| TF1 | AF4 | 200 | 0 | 0 | | | | | 808d |
| TF1 | AF5 | 200 | 0 | 0 | | | | | 808e |
| TF1 | AF6 | 200 | 0 | 0 | | | | | 808f |

1402
the receiver is configured to receive a first modulated radio frequency (RF) signal representing a first channel having a first carrier frequency and a first coverage area 1404
the receiver is positioned in the first coverage area 1406
the first modulated RF signal and a list of alternate channels for the first channel are received 1408
the receiver is moved from the first coverage area 1410
a second channel is selected from the received list of alternate channels based on historical information regarding prior alternate channel selections

FIG. 14

ALTERNATE RADIO CHANNEL SELECTION ADAPTED PER USER PATTERNS

BACKGROUND OF THE INVENTION

1. Field of the Invention

The present invention relates to radio systems, and more particularly, to radio systems providing alternate channels for tuned channels.

2. Background Art

The Radio Data System (RDS) specification allows a radio station to send a side-band stream of data along with the audio broadcast on a frequency modulated (FM) frequency signal. In the side-band provided data, the broadcaster can include a list of alternate frequencies (AF), which are other FM frequencies that carry broadcasts that are the same as that of the original radio station. A radio receiver can be configured to use the AF list information to automatically switch to a different frequency when the radio receiver goes out of range from the original radio station. For example, the radio receiver may be carried by an automobile or person. As the automobile or person moves, the radio receiver may move out of range of the original radio station, requiring the radio receiver to be tuned to one of the alternate frequencies.

However, when the AF list contains more than one alternate station, it is not known which of those alternate stations is preferable for selection. For example, it may not be known which of the alternate frequencies is receivable in the new location of the radio receiver. The radio receiver may be forced to cycle through the list of alternate stations, attempting to receive a signal at each alternate frequency, to find a receivable alternate frequency. This can take time, and thus may be an inconvenience to the radio listener.

Thus, what is needed are improved ways of selecting alternate frequencies in a radio receiver for carrier signals that provide alternate frequencies.

BRIEF SUMMARY OF THE INVENTION

Methods, systems, and apparatuses for selecting alternate channels for broadcast radio channels, and for tracking alternate channel selections, are provided. Some radio systems provide alternate channels, such as in the form of a list of alternate frequencies, for tuned radio channels to use when the tuned radio channel signal is no longer receivable. In aspects of the present invention, historical information is generated from alternate channel switching attempts. In further aspects of the present invention, the generated historical information is used to aid in making a subsequent switch to an alternate channel.

In an example aspect of the present invention, a receiver is configured to receive a first modulated radio frequency (RF) signal representing a first channel, and having a first carrier frequency and a first coverage area. The receiver is positioned in the first coverage area. The first modulated RF signal and a list of alternate channels for the first channel is received. The alternate channels may include alternate frequencies for the first carrier frequency, and/or may include alternate channels within the first carrier frequency. The receiver moves from the first coverage area. A second channel is selected from the received list of alternate channels based on historical information regarding prior alternate channel selections.

In a further aspect, a radio includes a receiver, storage, and a cross-correlator. The receiver is configured to receive a modulated radio frequency (RF) signal representing a first channel, and having a selected carrier frequency. The receiver is further configured to receive a list of alternate channels transmitted in a side band of the carrier frequency. The storage stores historical information regarding prior alternate channel selections. The cross-correlator is configured to select from the received list of alternate channels a carrier frequency to be received by the receiver based on the stored historical information.

In another aspect of the present invention, a first modulated RF signal representing a first channel having a first carrier frequency is received in a first coverage area. A list of alternate channels for the first channel is also received. The receiver is moved to a second coverage area. Attempts to receive a modulated RF signal in the second coverage area are made using at least one new channel from the list of alternate channels. Historical information is generated regarding the attempts to receive the modulated RF signal(s) using the new channelss) in the second coverage area.

In a further aspect, a radio includes a receiver and a historical information generator. The receiver is configured to receive a modulated radio frequency (RF) signal representing a first channel, and having a carrier frequency. The receiver is further configured to receive a list of alternate channels transmitted in a signal associated with the carrier frequency. The historical information generator is configured to generate historical information regarding attempts by the receiver to receive modulated RF signals of the alternate channels of the list.

These and other objects, advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 5 shows a flowchart providing example steps for generating alternate channel historical information, according to example embodiments of the present invention.

FIG. 6 shows an example alternate channel list received with a first carrier frequency, according to an embodiment of the present invention.

Figure 1:
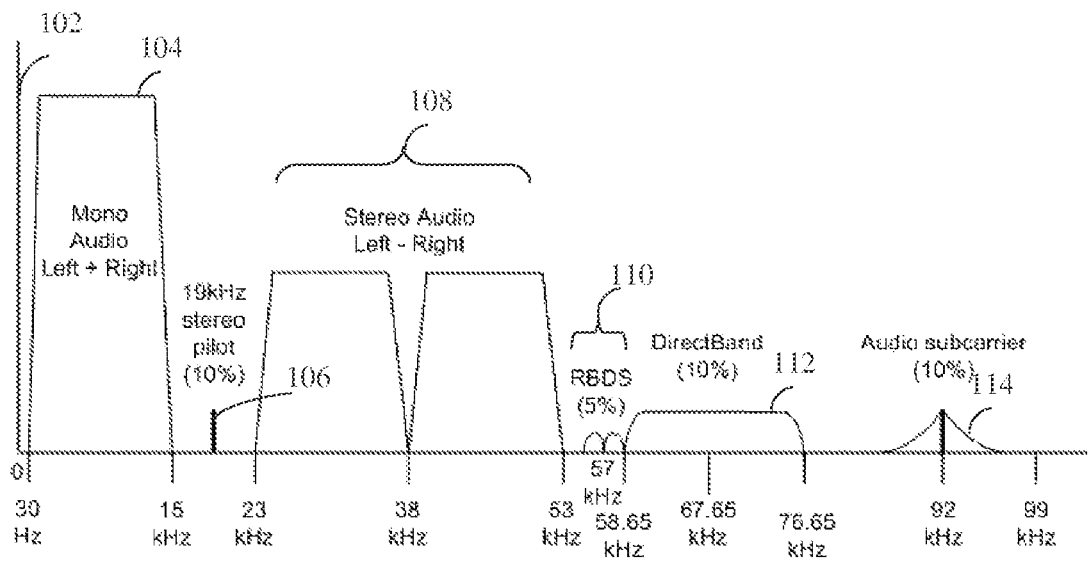
FIG. 1 shows an FM subcarrier spectrum.

FIGS. 8, 9, and 11-13 show example historical information lists, according to embodiments of the present invention.

FIG. 10 shows an alternate frequency received with a second carrier frequency, according to an example embodiment of the present invention.

FIG. 12 shows an example alternate channel list, according to an embodiment of the present invention.

FIG. 14 shows a flowchart providing example steps for selecting an alternate channel, according to example embodiments of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

The present specification discloses one or more embodiments that incorporate the features of the invention. The disclosed embodiment(s) merely exemplify the invention. The scope of the invention is not limited to the disclosed embodiment(s). The invention is defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Example Radio Systems

Embodiments of the present invention relate to radio broadcasts that provide an audio signal along with data providing information related to the audio signal. For example, the Radio Data System (RDS) is a standard from the European Broadcasting Union for transmitting digital information with conventional FM radio broadcasts. The RDS system standardizes several types of information transmitted, including time information, track/artist information, and broadcast station identification.

Radio Broadcast Data System (RBDS) is the official name used for the U.S. version of RDS. The two standards are very similar. A main difference is in which numbers are assigned to each of 31 musical and other broadcast program formats that the RBDS system can identify. The description and embodiments provided herein are applicable to both the RDS and RBDS standards. Because the systems are so similar, and for reasons of brevity, "RDS" may be used below to refer to both systems.

There are 100 FM channels allocated across the VHF FM band, having carrier signal frequencies from 88.1 MHz to 107.9 MHz, in 200 kHz increments. FIG. 1 shows an FM subcarrier spectrum 100 representing one FM channel. Spectrum 100 may include one or more of a mono audio band 104, a pilot tone 106, a stereo audio band 108, a RDS data band 110, a directband band 112, and an audio subcarrier 114. A sum signal ((left channel+right channel)/2) is transmitted in mono audio band 104 as baseband audio in the range of 30 Hz to 15 kHz. A difference signal ((left channel−right channel)/2) is transmitted in stereo audio band 108, which is amplitude-modulated onto a 38 kHz suppressed carrier to produce a double-sideband suppressed carrier (DSBSC) signal in the range of 23 kHz to 53 kHz. Pilot tone 106 is a 19 kHz pilot tone at half the 38 kHz subcarrier frequency, with a precisely defined phase relationship to it. Pilot tone 106 is transmitted at 8-10% of the overall modulation level, and is used by a receiver to regenerate the 38 kHz subcarrier with the correct phase. Directband 112 uses the 66.75kHz subcarrier leased by Microsoft from commercial radio broadcasters. The 66.75 kHz subcarrier carries data at a rate of 12 kbit/s. Audio subcarrier 114 provides a 92 kHz subcarrier frequency.

RDS data band 110 carries data according to the RDS/RDBS standards. Both standards use a 57 kHz sub-carrier frequency to carry data at 1187.5 bits per second. 57kHz was selected, because it is the third harmonic of pilot tone 106 for FM stereo, so does not cause interference or intermodulation with pilot tone 106, or with the stereo difference signal at 38 kHz.

RDS data band 110 allows for transmission of a variety of data types. For example, Table 1 below shows abbreviations and description for RDS information fields that may be transmitted by a station and received by a radio receiver:

TABLE 1

| | | |
|---|---|---|
| AF | Alternate Frequencies | enables station to provide a list of alternate frequencies for the broadcasting station that provide the same broadcast |
| CT | Clock Time | enables a clock in the receiver or the main clock in a car to synchronize |
| EON | Enhanced Other Networks | enables a receiver to monitor other stations for traffic broadcasts |
| MS | Music/Speech | enables the relative levels of speech and music to be altered |
| PI | Program Identification | a unique code that identifies the station; every station receives a specific code with a country prefix |
| PIN | Program Identification Number | identifies a program and enables the radio to turn itself on for that program |
| PTY | Program Type | coding for up to 31 pre-defined program types; enables users to find similar programming by genre |
| PS | Program Service | enables the name of the current station to be displayed by the radio |
| RT | Radio Text | enables radio station to transmit 64 characters of free-form textual information that can be either static, such as station slogans, or in sync with the programming, such as the title and artist of the currently-playing song |
| TDC | Transparent Data Channel | enables data to be downloaded |
| TP/TA | Travel Program/Travel Announcements | two flags that enable travel information to be heard, regardless of the choice of listening |

Figure 2:
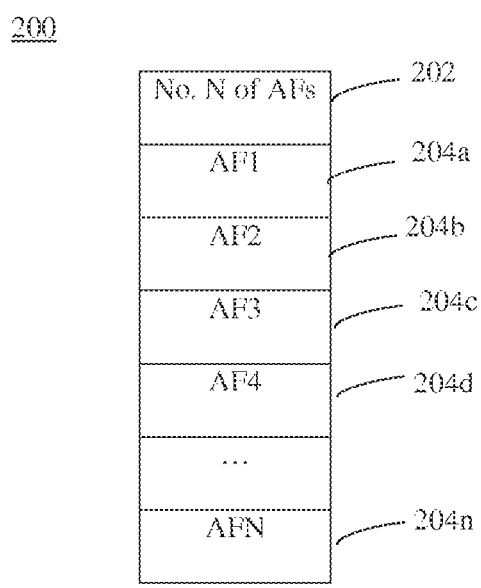
FIG. 2 shows an example alternate frequency list provided by a broadcasting station according to the Radio Data System standards.

In particular, the alternate frequencies (AF) information field enables a receiver to re-tune to a different frequency providing the same station content when the first signal becomes too weak. This may be useful when the radio receiver is mobile, such as in a car, airplane, boat, or other vehicle, or is carried by a person. FIG. 2 shows an example AF list 200 provided by a broadcasting station according to the RDS standards. Each row of AF list 200 shown in FIG. 2 is a byte of data. As shown in FIG. 2, in a first row 202, a number of alternate frequencies in the list is provided. Subsequent rows 204a-204n of the list each provide an alternate frequency for the tuned carrier frequency for the current broadcast station. AF list 200 is a "method A" type AF list for the RDS standard. Embodiments are applicable to the method A type list and to other type lists, including the "method B" type list for the RDS standard. The "method B" type list is similar to the method A type list, further enabling an indication of alternate frequencies in different regions which at times may carry different programs than the currently tuned frequency.

The list of alternative frequencies provides information on transmitters broadcasting the same program in the same or adjacent reception areas. A receiver may store the list, to reduce a time for switching to another transmitting station. This is particularly useful for cars and portable radios.

The program identification (PI) code enables the receiver to distinguish between countries, areas in which the same program is transmitted, and the identification of the program itself. The PI code is not intended for direct display. The PI code is assigned to each individual radio program, to enable each program to be distinguished from all other programs. The PI code enables the receiver to search automatically for an alternative frequency in the AF list in case of bad reception for the currently tuned program. A new frequency may be located having a better signal and having the same program identification code. For example, the receiver may scan through the list of alternate frequencies in the AF list to find a stronger or strongest signal. The receiver may then be tuned to the alternate frequency having the stronger/strongest signal.

However, when the AF list contains more than one alternate frequency, it may be time consuming to sequence through the AF list every time a coverage area for a current signal is exited by the radio. Thus, what is needed are improved ways of selecting alternate frequencies in a radio receiver. Embodiments of the present invention are described below that provide improved ways of selecting alternate frequencies.

Example Embodiments

The example embodiments described herein are provided for illustrative purposes, and are not limiting. The examples described herein may be adapted to any type of radio receiver device. Example embodiments are described below with respect to the RDS (including the RDBS) standard. However, embodiments may also be applied to radio standards other than the RDS standard, as would be known to persons skilled in the relevant art(s) from the teachings herein. For example, embodiments may include radio standards for broadcasting audio according to AM, FM, or other radio types, where data is broadcast in association with the broadcast audio. For instance, embodiments may be implemented in CDMA (code division multiple access), GSM (Global System for Mobile communications), UMTS (Universal Mobile Telecommunications System), and other types of radio systems. Additional structural and operational embodiments, including modifications/alterations, will become apparent to persons skilled in the relevant art(s) from the teachings herein.

Embodiments of the present invention provide adaptability to a radio user's unique circumstances. Mobile radio users tend to have patterns in their travel routes. Along these travel routes, alternate radio channel selections are needed to be made. Embodiments of the present invention track alternate radio channel switching attempts. By tracking previous alternate channel switching attempts, the success and timeliness of future alternate channel switching increases.

Example embodiments for alternate channel selection are described in detail below. Such embodiments frequently illustrate the usage of alternate "frequency" selection, where a new carrier frequency for a radio broadcast is selected. However, embodiments for alternate channel selection also encompass selecting an alternate channel within a same carrier frequency. For example, in a CDMA (code division multiple access) radio system embodiment, multiple radio channels exist within a single carrier frequency, in the form of different pseudo-random code sequences. Thus, alternate channels as used herein may refer to alternate carrier frequencies, as well as alternate channels within a same carrier frequency, such as those that may be referred to by pseudo-random code sequence or other channel identifier.

Figure 3:
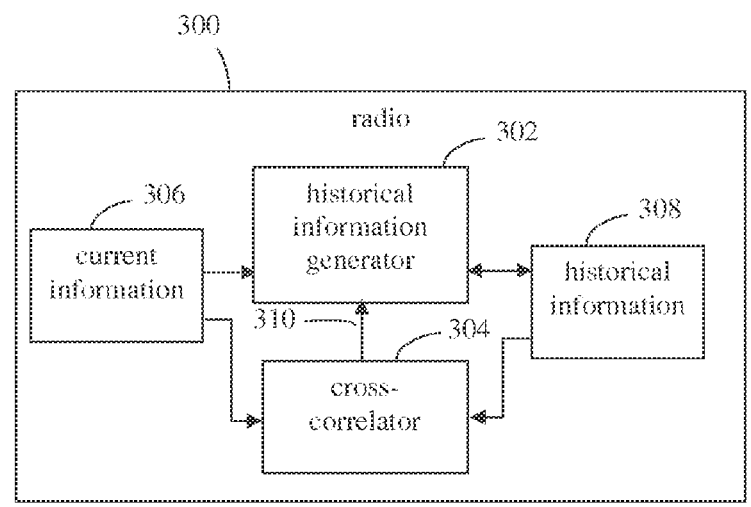
FIG. 3 shows a block diagram of a radio, according to an embodiment of the present invention.

FIG. 3 shows a block diagram of a radio 300, according to an embodiment of the present invention. Radio 300 may be any type of radio or radio-including device, such as a car stereo, a handheld radio, a cell phone with radio capability, a mobile computer (e.g., PDA, BLACKBERRY, laptop, etc.) with radio capability, a handheld music player (e.g., an APPLE IPOD, an MP3 player, etc.) with radio capability, or other radio device.

As shown in FIG. 3, radio 300 includes a historical information generator 302 and a cross-correlator 304. As shown in FIG. 3, historical information generator 302 receives current information 306 and historical information 308. Current information 306 includes current information relating to a current signal being received. For example, current information 306 may include a carrier frequency of the current radio signal being received, a list of alternate channels (e.g., AF list 200 shown in FIG. 2), a current time (at which the radio signal is being received), a current day of the week, whether the current day is a weekend or weekday, a current geographic location of radio 300, etc. Historical information generator 302 uses current information 302 to generate historical information 308. Historical information 308 includes information regarding past alternate channel selections that may be used by cross-correlator 304 to generate a new alternate channel selection 3 10. For example, historical information 302 may include a historical list of received transmit frequencies with corresponding alternate frequency choices. Furthermore, the historical list may include a generated score for each transmit frequency/alternate frequency combination. The generated score may indicate a success rate for switching frequency from the transmit frequency to a corresponding alternate frequency. The historical list may also include time information, day of week information, a weekday/weekend indication, geographic location information, etc. Historical information generator 302 may generate updated historical information 308 using new alternate channel selection 310 and current information 302.

Cross-correlator 304 compares current information 306 with historical information 308 to determine a new alternate channel selection 310. At each alternate channel selection decision point (e.g., when a coverage area for the current transmit channel is exited by radio 300), cross-correlator 304 cross-correlates past alternate channel attempt information of historical information 308 with current information 306 to select a best alternate channel candidate to become the new transmit channel of radio 300. The cross-correlation performed by cross-correlate 304 improves the success rate for the alternate channel switch when compared to conventional systems. By increasing and varying the amount of historical information 308 retained, the success rate of determining an effective alternate channel can be improved.

Historical information generator 302 and cross-correlator 304 may be implemented in hardware, software, firmware, of any combination thereof. For example, historical information generator 302 and cross-correlator 304 may each be implemented in digital logic, such as in an integrated circuit (e.g., an application specific integrated circuit (ASIC)), in code executing in a processor, and/or in other manner as would be known to persons skilled in the relevant art(s).

Figure 4:
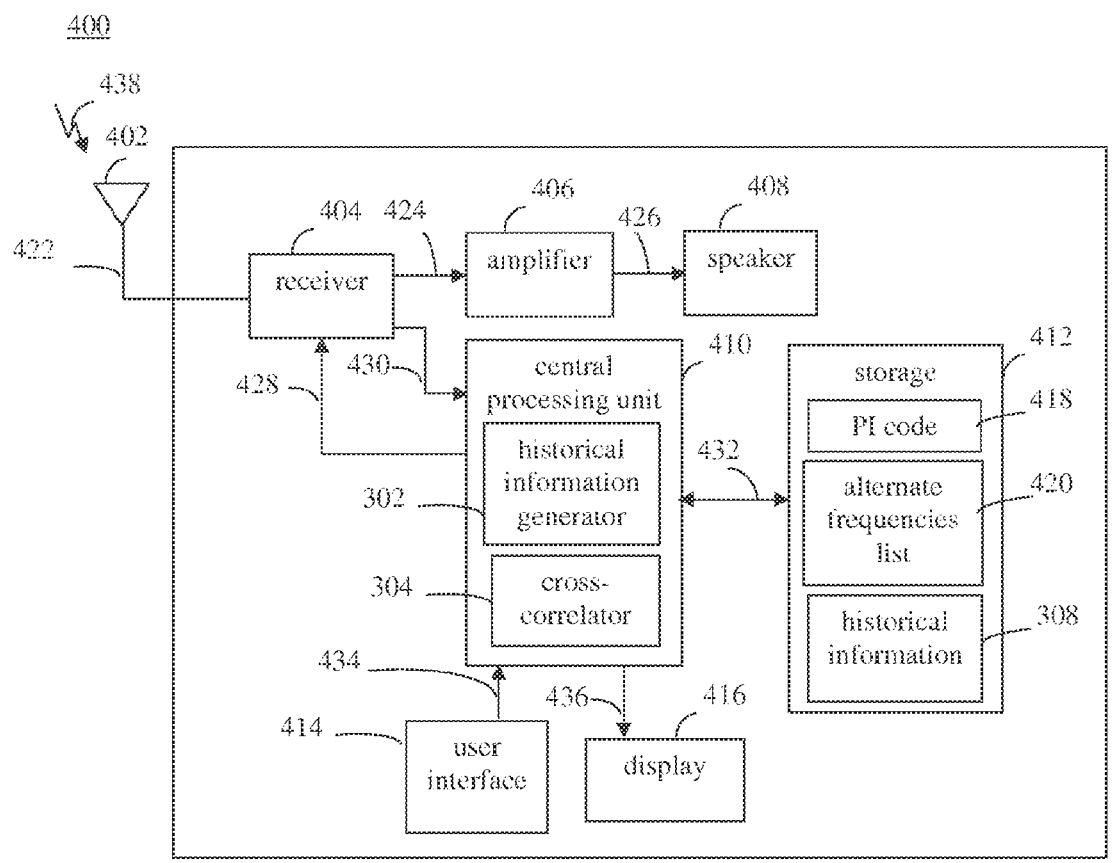
FIG. 4 shows a radio, which is an example of the radio shown in FIG. 3, according to embodiment of the present invention.

FIG. 4 shows a radio 400, which is an example of radio 300, according to embodiment of the present invention. As shown in FIG. 4, radio 400 includes an antenna 402, a receiver 404, an amplifier 406, a speaker 408, a central processing unit (CPU) 410, a storage 412, a user interface 414, and a display 416.

Receiver 404 receives a modulated RF signal 438 from antenna 402, which is received by antenna 402 from a broadcasting radio station. Receiver 404 receives a tuning signal 428 from CPU 410 which determines the carrier signal to which receiver 404 is tuned. Receiver 404 down-converts and demodulates the received signal 438 to a baseband audio signal 424. Furthermore, receiver 404 down-converts and demodulates a side-band data signal of modulated RF signal 438 to a baseband data signal 430. The baseband data signal 430 contains data regarding the broadcasting station, the content of modulated RF signal 438, and/or other data. For example, in an embodiment, side-band data signal is RDS data band 110, and thus baseband data signal 430 includes one or more of the RDS information fields shown above in Table 1 or otherwise known.

Receiver 404 may be any suitable type of radio receiver. For example, receiver 404 may include one or more mixers and oscillators configured in a heterodyne configuration such as a superheterodyne configuration, a direct down-conversion configuration, etc. Receiver 404 may include a pair of filters and/or demodulators as needed, to separately demodulate baseband audio signal 424 and baseband data signal 430 from received modulated RF signal 438, if desired. Receiver 404 may be configured to receive and demodulate an AM signal, an FM signal, or other signal type.

Amplifier 406 receives and amplifies baseband audio signal 424 to generate an amplified audio signal 426. Amplifier 406 may include any number of one or more amplifiers and/or filters, including a power amplifier. Speaker 408 receives amplified audio signal 426, and outputs corresponding sound (e.g., music and/or voice from the source radio station). Speaker 408 can be any type of radio speaker in a common housing with the other components of radio 400, or separate from radio 400 and coupled to radio 400 by wired and/or wireless links.

CPU 410 is coupled to each of receiver 404, storage 412, user interface 414, and display 416. CPU 410 may be individually connected to these components, or one or more of these components may be connected to CPU 410 in a common bus structure. In an embodiment, CPU 410 may include one or more integrated circuits, including digital logic and/or a processor. CPU 410 monitors user input at user interface 414 and causes corresponding display at display 416. As shown in FIG. 4, CPU 410 includes historical information generator 302 and cross-correlator 304. CPU 410 generates tuning signal 428 based on user input received a user interface 414 and/or an alternate channel selection generated by cross-correlator 304.

For example, in an embodiment, a user may interact with user interface 414 to select an initial broadcasting station to which receiver 404 is to be tuned. CPU 410 generates tuning signal 428 to tune receiver 404 to receive the desired broadcasting station. Subsequently, such as when radio 400 is moved such that radio 400 leaves a coverage area of the desired broadcasting station (e.g., is moved such that the broadcast RF modulated signal of the desired broadcasting station is poorly received or is lost), cross-correlator 304 may select an alternate channel for the desired broadcasting station. CPU 410 generates tuning signal 428 to tune receiver 404 to receive a modulated RF signal at the selected alternate channel.

Furthermore, information (e.g., current information 306) is received by CPU 410 on baseband data signal 430. Historical information generator 430 processes the information received on data signal 430, and stores the processed information as historical information 308 in storage 412.

Storage 412 may be any suitable type of storage device, such as a memory (e.g., FLASH memory) or hard drive. As shown in FIG. 4, storage 412 may store a PI code 418, an alternate channels list such as alternate frequencies list 420, and historical information 308. PI code 418 may be a program identification code for the currently tuned broadcast station. Alternate frequencies (AF) list 420 (e.g., AF list 200) is a list of one or more alternate frequencies for the currently tuned broadcast station. PI code 418 and AF list 420 are received in baseband data signal 430.

User interface 414 enables a user of radio 400 to interact with radio 400 to select a radio station, to select between AM/FM, to change volume, tone, treble, bass, etc., and to use other features of radio 400 that may be present. User interface 414 may include one or more buttons, one or more dials, a keyboard, a voice activated input system, a wheel such as a click wheel, etc. Display 416 displays information regarding radio 400, including information received in baseband data signal 428, such as a current station, information regarding a song currently being played, etc. Display 416 may include any type of display mechanism, including one or more LEDs (light emitting diodes), an LCD (liquid crystal display) panel, etc.

FIG. 5 shows a flowchart 500 providing example steps for generating alternate channel historical information, according to example embodiments of the present invention. Other structural and operational embodiments will be apparent to persons skilled in the relevant art(s) based on the following discussion. Flowchart 500 may be performed by radio 400, for example. The steps shown for flowchart 500 can be performed in an order different from that shown in FIG. 5. Furthermore, not all steps of flowchart 500 necessarily need to be performed in all embodiments.

Flowchart 500 begins with step 502. In step 502, a first modulated RF signal representing a first channel having a first carrier frequency and a list of alternate channels for the first carrier frequency is received in a first coverage area. For example, as shown in FIG. 4, radio 400 receives modulated RF signal 438. Modulated RF signal 438 has a carrier frequency on which audio information is modulated (e.g., FM, AM, etc.). The carrier frequency has a coverage area which may be dictated by a transmit power of the carrier signal, any obstacles in the area, interference from other signals, etc. The coverage area for a carrier signal is generally defined as an area in which modulated RF signal 438 can be well received by a radio 400. Outside of the coverage area, modulated RF signal 438 is not well received, or is lost, such that a user of radio 400 would desire to change radio stations.

As described above, a side band data signal may be associated with the carrier frequency having data, such as data according to the RDS/RDBS standards. Such data may include a list of alternate frequencies for the carrier frequency of modulated RF signal, such as AF list 200 shown in FIG. 2. For example, FIG. 6 shows an example AF list 600 received with a first carrier frequency, TF1. As shown in FIG. 6, AF list 600 indicates in a record or row 202 that six alternate frequencies for the present carrier frequency, TF1, are listed in AF list 600. In records or rows 204a-204f, the alternate frequencies are listed as AF1-AF6.

Figures 7, 8:
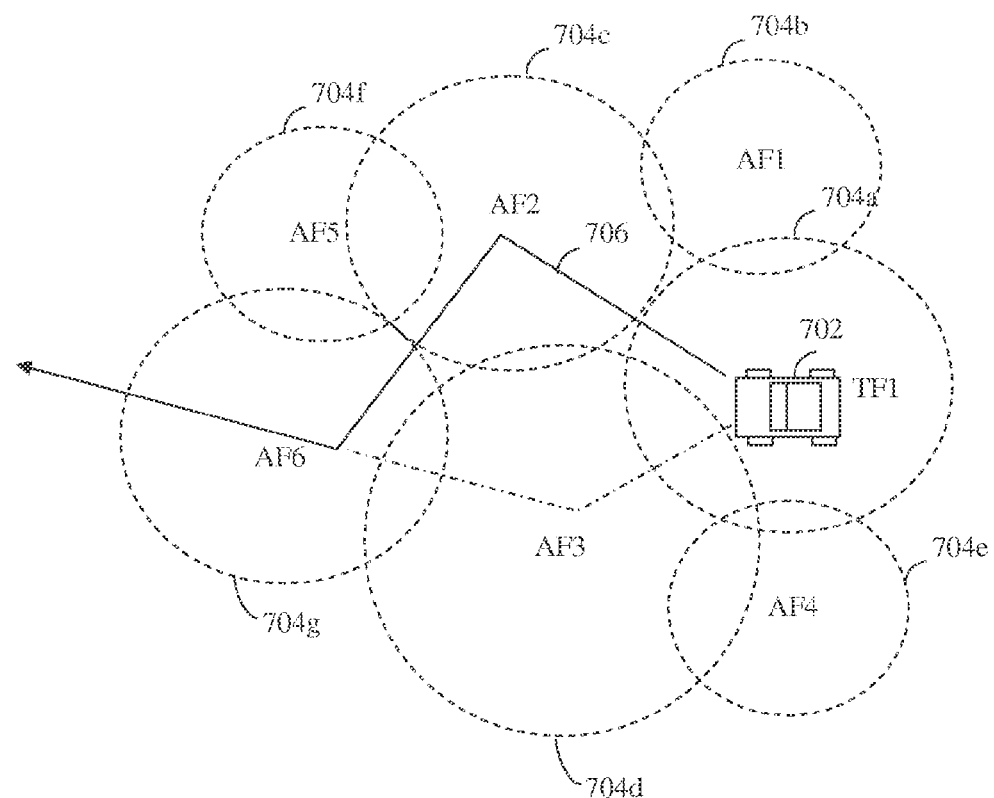
FIG. 7 shows a transport mechanism that travels through coverage areas for transmitted carrier signals, according to an embodiment of the present invention.

In step 504, the receiver is moved to a second coverage area. For example, FIG. 7 shows a radio transport 702 traveling through coverage areas, according to an embodiment of the present invention. Transport 702 carries radio 400 (not shown in FIG. 7). Transport 702 is shown in FIG. 7 as an automobile for illustrative purposes, but in alternative embodiments, transport 702 could be a truck, a boat, an airplane, a person, or other transport mechanism for radio 400. Transport 702 moves along a path 706, which may be any type of route. As shown in FIG. 7, transport 702 is located in a first coverage area 704*a*. Coverage area 704*a* is a coverage area for the currently tuned transmit carrier frequency, TF1. Coverage areas 704*b*-704*e* adjoin or overlap first coverage area 704*a*, and include alternate frequencies for the current carrier frequency, TF1. Coverage area 704*b* contains a radio station that uses AF1, coverage area 704*c* contains a radio station that uses AF2, coverage area 704*d* contains a radio station that uses AF3, and coverage area 704*e* contains a radio station that uses AF4, of AF list 600 as carrier frequencies.

According to step 504, transport 702 moves along a first segment of path 706 from first coverage area 704*a* to a second coverage area, which is coverage area 704*c*. Radio 400 has reduced reception of the currently tuned radio signal as coverage area 704*a* is exited. However, transport 702 is not necessarily aware that it is entering coverage area 704*c*.

In step 506, a modulated RF signal in the second coverage area is attempted to be received using at least one new channel selected from the list of alternate channels. For example, radio 400 may detect that first coverage area 702 is being exited, though reduction or loss of signal (e.g., a low return signal strength indication (RSSI)). In second coverage area 704*c*, radio 400 begins to cycle through the alternate frequencies present in AF list 600 for the currently tuned transmit carrier frequency, TF1. For example, referring to FIG. 4, CPU 410 may access alternate frequencies list 420 in storage 412, and provide these sequentially to receiver 404 via tuning signal 428 to determine whether transmissions are received on one or more of the alternate frequencies. In the example of FIG. 7, an acceptable signal may only be returned on alternate frequency AF2 because transport 702 is only in coverage area 704*c* for AF2. CPU 410 may verify that alternate frequency AF2 is a matching broadcast for the transmit frequency TF1 by determining whether the PI code received for alternate frequency AF2 matches stored PI code 418 for TF1.

In step 508, historical information is generated regarding the attempt to receive a modulated RF signal using at least one new channel in the second coverage area. Referring back to FIG. 4, historical information generator 302 uses the results of the attempts to receive modulated RF signals in step 506 to generate historical information 308. In an initial case, historical information 308 may be empty. For example, historical information 308 may appear as shown for a historical information list 800 shown in FIG. 8, which relates to using alternate frequencies as alternate channels. As shown in FIG. 8, historical information list 800 includes a transmit frequency column 802, an alternate frequency column 804, and a score column 806. Alternate frequency column 804 lists the alternate frequencies of AF list 600 for carrier frequency TF1 listed in transmit frequency column 802. Score column 806 lists success scores 808 for attempts to receive each alternate frequency listed in column 804 after leaving the coverage area for the transmit carrier frequency in column 802. In the current example, six alternate frequencies AF1-AF6 are present for the current transmit carrier frequency TF1. Because historical information list 800 in FIG. 8 is an initial list, scores 808*a*-808*f* are zeros.

FIG. 9 shows list 800 for the current example, after receiving alternate frequency AF2, but no other alternate frequencies, during the attempts of step 506 of flowchart 500. Because AF2 was received, row 808*b* for the combination of TF1 and AF2 receives score of 100, while rows 808*a* and 808*c*-808*f* for the combinations of TF1 with AF1 and AF3-AF5 receive zero scores.

Note that in the current example, a score of 100 means that the AF is always received when leaving the coverage area of the currently tuned TF, while a score of 0 means that the AF is never received when leaving the coverage area of the currently tuned TF. However, in other embodiments, other scoring ranges and mechanisms may be used, as would be understood to persons skilled in the relevant art(s).

Steps 502-508 of flowchart 500 can be repeated multiple times during the transit of transport 702. For example, after transport 702 enters second coverage area 704*c*, in step 502, radio 400 of transport 702 receives a second modulated RF signal from a broadcast station in second coverage area 704*c* having AF2 as carrier frequency TF2. Furthermore, radio 400 may receive and store a second list of alternate frequencies for that carrier frequency in storage 412 as alternate frequencies list 420, and may receive and store a newly received PI code as PI code 418. For example, FIG. 10 shows an AF list 1000 for the carrier frequency TF2 (which is AF2). AF list 1000 indicates in row 202 that six alternate frequencies for the present carrier frequency, TF1, are listed in AF list 600. In rows 204*a*-204*f*, the alternate frequencies are listed as AF I and AF3-AF7.

In step 504, transport 702 moves along a second segment of path 706 from second coverage area 704*c* to a third coverage area, which is coverage area 704*g*. In step 506, radio 400 may detect that second coverage area 704*c* is being exited, and begin to cycle through the alternate frequencies present in AF list 1000 of FIG. 10 for the current transmit carrier frequency, TF2 (AF2), in any manner, to find a new receive carrier frequency. In the example of FIG. 7, an acceptable signal may only be returned on alternate frequency AF6 because transport 702 is only in coverage area 704*g* for AF6.

Figure 11:
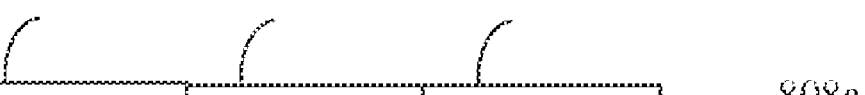

In step 508, historical information generator 302 of FIG. 4 uses the results of the attempts to receive modulated RF signals in third coverage area 704*g* to generate historical information 308. FIG. 11 shows list 800 for the current example, after receiving a transmission on alternate frequency AF6, but on no other alternate frequencies, during the attempts of step 506 in third coverage area 704*g*. As shown in FIG. 11, rows 808*g*-808*l* are added to historical list 800 for the newly attempted combinations of current transmit frequency TF2 and alternate frequencies AF1 and AF3-AF7. Furthermore, because AF6 was successfully received, row 808*k* for the combination of TF2 and AF6 receives a score of 100, while rows 808*a* and 808*c*-808*f* receive zero scores for failed attempts at the combinations of transmit frequency TF2 with alternate frequencies AF1 and AF3-AF7 to receive signals.

In the current example, transport 702 may move along further segments of path 706 while further repeating steps 502-508 of flowchart 500. When further transmit frequencies for additional broadcast stations are encountered, additional rows may be added to historical information list 800 for the different combinations of transmit frequency with the different alternate frequencies, along with their scores.

Note that transport 702 may repeat path 706. For example, path 706 may be a route that a driver of transport 702 takes to work, school, makes deliveries, shopping, transporting others, etc., on a daily or other basis. Thus, steps 502-508 of flowchart 500 may be repeated multiple times for the first, second, and further segments of path 706. Furthermore, paths alternative to path 706 may be taken by transport 702. For example, if traffic is bad along path 706, a driver of transport 702 that would normally take path 706 may alternatively drive along a path 708, which passes from coverage area 704a to coverage area 704d, to coverage area 704g. Steps 502-508 of flowchart 500 may be repeated multiple times for the additional paths. Cumulative scores may be generated in score column 806 for the repeated attempts.

In an embodiment, historical information list 800 may include further columns, such as shown for a historical information list 1200 in FIG. 12, which lists a number of times an alternate frequency has been attempted in a column 1202, and a number of successful attempts in a column 1204. Furthermore, historical information list 1200 includes non-zero scores in additional rows other than just those corresponding to path 706.

For instance, in the current example, transport 702 passes either along path 706 or path 708. Furthermore, transport 702 has moved from coverage area 704a two hundred times. Thus, transport 702 has performed step 506 of flowchart 500 two hundred times, as indicated in column 1202 for the rows corresponding to TF1. In particular, transport 702 has moved from coverage area 704a to coverage area 704c 160 times, and from coverage area 704a to coverage area 704d 40 times. Thus, after leaving coverage area 704a of TF1, alternate frequency AF2 (on path 706) has been successfully received 160 times, and alternate frequency AF3 (path 708) has been successfully received 40 times, while other alternative frequencies of TF1 have been unsuccessful (0 successful attempts), as indicated in column 1204. The following equation may be used to generate the score shown in column 806 for each row in historical information list 1200 of FIG. 12, based on columns 1202 and 1204:

$$\text{Score (column 806)} = \frac{100 \times \text{No. of successful attempts (col. 204)}}{\text{No. of attempts (column 1202)}}$$

Thus, in row 808b, the score for AF2=100×160/200=80. In row 808c, the score for AF3=100×40/200=20. All other scores for alternate frequencies of TF1 are zero. Thus, in the current example, when transport 702 is in coverage area 704a, there is an 80% chance transport 702 will transit to coverage area 704c, and a 20 percent chance transport 702 will transit to coverage area 704d.

Thus, in the current example, transport 702 has moved from coverage area 704c 160 times, as indicated in column 1202 for the rows corresponding to TF2. Every time transport 702 moved from coverage area 704c, it entered coverage area 704g. Thus, after leaving coverage area 704c of TF2, alternate frequency AF6 (path 706) has been successfully attempted all 160 times, while other alternative frequencies of TF2 have been unsuccessful (0 successful attempts), as indicated in column 1204. In row 808k, the score for AF6=100×160/160=100. All other scores for alternate frequencies of TF2 are zero. Thus, in the current example, when transport 702 is in coverage area 704c, there is a 100% chance transport 702 will transit to coverage area 704g.

Furthermore, in the current example, transport 702 has moved from coverage area 704d 40 times, as indicated in column 1202 for the rows corresponding to TF3 (AF3). Transport 702 moved from coverage area 704d to coverage area 704g all 40 times. Thus, after leaving coverage area 704d of TF3, alternate frequency AF6 (path 706) has been successfully attempted all 40 times, while other alternative frequencies of TF3 have been unsuccessful (0 successful attempts), as indicated in column 1204. In row 808q, the score for AF6=100×40/40=100. All other scores for alternate frequencies of TF3 are zero.

Thus, in the current example, when transport 702 is in coverage area 704d, there is a 100% chance transport 702 will transit to coverage area 704g.

Thus, historical information generator 302 generates historical information 308, such as in the form of historical information list 800 or 1200, which can be used to predict which coverage area radio 400 will enter from a prior coverage area. This information can be used to predict which alternate channel to tune to from the transmit radio channel tuned for the prior coverage area. Historical information lists can have a variety of forms. For example, a historical information list may be in list or table form, such as shown in FIGS. 8 and 12, may be a multi-dimensional array, or may have other form, as would be known to persons skilled in the relevant art(s).

In further embodiments, historical information generator 302 may include further and/or alternative information in a historical information list to be used to for making alternate channel selections. For example, FIG. 13 shows a historical information list 1300 generated by historical information generator 302, according to embodiments of the present invention. As shown in FIG. 13, historical information list 1300 includes columns 802, 804, 1202, 1204, and 806 of historical information list 1200 in FIG. 12, with the addition of columns 1302, 1304, 1306, and 1308 (rows 808g-808r are not shown in FIG. 13, for reasons of brevity). The information of these additional columns may be used individually or in combination to aid in predicting future alternate channel switches from prior transmit radio channels. Any combination of one or more of columns 806, 1302, 1304, 1306, and 1308 may be present in a historical information list, in embodiments of the present invention.

For each row 808, column 1302 lists an average time of day at which a successful attempt is made to receive an alternate frequency of column 804 when moving out of a coverage area of the corresponding transmit frequency of column 802. Thus, historical information generator 302 may track times at which a successful transition from a transmit frequency to an alternate frequency is made. The tracked times can be used to select an alternate frequency for a current transmit frequency. For instance, an alternate frequency is selected that has a time value approximately the same as a time at which an alternate frequency switch is attempted. Radio 400 may include a clock module that can determine a current time. Alternatively, radio 400 may receive the current time in baseband RDS data 430. The determined current time can be passed to historical information generator 302, which stores the current time in historical information list 1300.

For each row 808, column 1304 lists one or more days of the week when a successful attempt is made to receive an alternate frequency of column 804 when moving out of a coverage area of the corresponding transmit frequency of column 802. Thus, historical information generator 302 may track specific days of the week at which a successful transition from a transmit frequency to an alternate frequency is made. The tracked days can be used to select an alternate frequency for a current transmit frequency. For instance, an alternate frequency is selected having a day of week value approximately the same as a day of week at which an alternate frequency switch is attempted. Radio 400 may include a calendar module that can determine a current day. The determined current day can be passed to historical information generator 302 for storage in historical information list 1300.

For each row 808, column 1306 lists a weekday or weekend indication when a successful attempt is made to receive an alternate frequency of column 804 when moving out of a coverage area of the corresponding transmit frequency of column 802. Thus, historical information generator 302 may track whether a successful transition from a transmit frequency to an alternate frequency is made on a weekday or weekend. The tracked weekday/weekend value can be used to select an alternate frequency for a current transmit frequency. For instance, an alternate frequency is selected having a weekday or weekend indication approximately the same as a weekday or weekend at which an alternate frequency switch is attempted. Radio 400 may include a calendar module that can determine a current day. The determined current day can be passed to historical information generator 302, which generates a weekend/weekday indication for storage in historical information list 1300.

For each row 808, column 1308 lists a geographic location where a successful attempt is made to receive an alternate frequency of column 804 when moving out of a coverage area of the corresponding transmit frequency of column 802. Thus, historical information generator 302 may track a location where a successful transition from a transmit frequency to an alternate frequency occurs. The tracked location can be used to select an alternate frequency for a current transmit frequency. For instance, an alternate frequency is selected having a location value approximately the same as a location at which an alternate frequency switch is attempted. Radio 400 may include a global position service (GPS) module that can determine a location of radio 400. The determined location can be passed to historical information generator 302 for storage in historical information list 1300.

Historical information 308 generated by historical information generator 302 can be used by cross-correlator 304 to select an alternate channel to switch to from a currently tuned channel for a radio. FIG. 14 shows a flowchart 1400 providing example steps for selecting an alternate channel, according to example embodiments of the present invention. Other structural and operational embodiments will be apparent to persons skilled in the relevant art(s) based on the following discussion. Flowchart 1400 may be performed by radio 400, for example. The steps shown for flowchart 1400 can be performed in an order different from that shown in FIG. 14. Furthermore, not all steps of flowchart 1400 necessarily need to be performed in all embodiments.

Flowchart 1400 begins with step 1402. In step 1402, the receiver is configured to receive a first modulated radio frequency (RF) signal representing a first channel having a first carrier frequency and a first coverage area. For example, referring back to FIG. 4, radio 400 may be configured to receive modulated RF signal 438. Modulated RF signal 438 has a carrier frequency on which audio information is modulated (e.g., FM, AM, etc.). As described above, CPU 410 configures tuning signal 428 to cause receiver 404 to downconvert and demodulate modulated RF signal 438, due to user selection of a radio station at user interface 414 or an alternate frequency selection (from a prior tuned frequency) by cross-correlator 304.

In step 1404, the receiver is positioned in the first coverage area. For example, as shown in FIG. 7, transport 702 having radio 400 is positioned in coverage area 704a for a carrier frequency of TF1. Radio 400 may have been powered up in coverage area 704a, moved into coverage area 704a from another coverage area, or have been otherwise positioned in coverage area 704a.

In step 1406, the first modulated RF signal and a list of alternate channels for the first channel are received. As shown in FIG. 4, radio 400 receives modulated RF signal 438. Furthermore, as described above, a side band data signal may be associated with the carrier frequency having data, such as data according to the RDS/RDBS standards. Such data may include a list of alternate frequencies for the carrier frequency of modulated RF signal, such as AF list 1000 shown in FIG. 10.

In step 1408, the receiver is moved from the first coverage area. For example, as shown in FIG. 7, transport 702 moves radio 400 from coverage area 704a along path 706 to coverage area 704c. Upon moving from coverage area 704c, the radio signal having coverage area 704a is no longer well received, and an alternate frequency switch is desired.

In step 1410, a second channel is selected from the received list of alternate channels based on historical information regarding prior alternate channel selections. In an embodiment, cross-correlator 304 cross-correlates current information 306 with historical information 308 to determine the second carrier frequency from the list of alternate frequencies received with the currently tuned carrier frequency. For example, the historical information is provided in a historical information list, such as list 1200 shown in FIG. 12, or in other form. Cross-correlator 304 cross-correlates current information 306 with historical information 308 to find a best candidate alternate frequency.

For example, in an embodiment, current information 306 includes the first carrier frequency (i.e., the tuned carrier frequency) and associated alternate frequency list (e.g., shown as alternate frequencies list 420 in FIG. 4), and historical information 308 includes a historical list of transmit frequencies (column 802 in FIG. 8), one or more alternate frequencies for each of the transmit frequencies (column 804 in FIG. 8), and a score for each of the one or more alternate frequencies for each of the transmit frequencies (column 806 in FIG. 8). Cross-correlator 304 selects the alternate frequency from column 804 having a higher score relative to scores for others of the one or more alternate frequencies for the matching transmit frequency. In the current example of FIG. 12, TF1 in column 802 has six alternate frequencies in column 804, AF1-AF6. In column 806, AF2 has a higher score of 80 versus scores for AF1 and AF3-AF6. Thus, cross-correlator 304 selects AF2 as the alternate frequency to switch to from the currently tuned carrier frequency of TF1. CPU 410 instructs receiver 404 to switch to the carrier frequency AF2, using tuning signal 428. Receiver 404 receives a new modulated RF signal 438 having carrier frequency AF2, which presumably contains the same content as the prior received signal. In an embodiment, cross-correlator 304 compares PI code 418 of carrier frequency TF1 stored in storage 412 to a new received PI code for carrier frequency AF2 to confirm that the same content is provided by the two stations.

In another embodiment, current information 306 includes the first carrier frequency, the associated alternate frequency list, and the current time, and historical information 308 includes a historical list of transmit frequencies, one or more alternate frequencies for each of the transmit frequencies, and a time value (e.g., in column 1302 of FIG. 13) for each of the one or more alternate frequencies for each of the transmit frequencies. Cross-correlator 304 selects the alternate carrier frequency from column 804 having a time value matching the current time more closely than time values for others of alternate frequencies. In the example of FIG. 13, the current time may be 9:10 am. In column 1302, AF3 has a time value of 9:00 am more closely matching the current time of 9:10 am as compared to AF1, AF2, and AF4-AF6. Thus, cross-correlator 304 selects AF3 as the alternate frequency to switch to from the currently tuned carrier frequency of TF1.

Such an embodiment, and further time/date based embodiments described herein, may be useful when an operator of transport 702 has common date/time-based traveling patterns. For example, at 8:00 am, the operator of transport 702 may travel to work along path 706 during normal circumstances. However, the operator of transport 702 may travel to work along alternate path 708 when he/she is delayed (e.g., running late, etc.) and path 706 has too much traffic. Thus, by using time-based information, cross-correlator 304 can better select an alternate frequency during the operator's morning work commute. This embodiment is applicable to any other time-based traveling patterns, including commuting home from work, commutes to and from school, shopping, making deliveries, etc.

In another embodiment, current information 306 includes the first carrier frequency, the associated alternate frequency list, and the current time, and historical information 308 includes a historical list of transmit frequencies, one or more alternate frequencies for each of the transmit frequencies, a time value (e.g., in column 1302) and a score (e.g., in column 806) for each of the one or more alternate frequencies for each of the transmit frequencies. Cross-correlator 304 selects one or more alternate frequencies from column 804 having a time value that substantially matches the current time. Cross-correlator 304 selects the alternate frequency having the highest score from these selected alternate frequencies. In the example of FIG. 13, the current time may be 8:30 am. In column 1302, AF2 as a time value of 8:00 am and AF3 has a time value of 9:00 am, which both substantially match the current time of 8:30 am. From AF2 and AF3, cross-correlator 304 selects AF2 as the alternate frequency because it has the higher score of 80 compared to the score of 20 for AF3.

In another embodiment, current information 306 includes the first carrier frequency, the associated alternate frequency list, the current time, and a current day of the week, and historical information 308 includes a historical list of transmit frequencies, one or more alternate frequencies for each of the transmit frequencies, a time value (e.g., in column 1302), a day of the week value (e.g., in column 1304), and a score (e.g., in column 806) for each of the one or more alternate frequencies for each of the transmit frequencies. Cross-correlator 304 selects one or more alternate frequencies from column 804 having a time value that substantially matches the current time and a day of the week value that matches the current day of the week. Cross-correlator 304 selects the alternate frequency having the highest score from these selected alternate frequencies. In the example of FIG. 13, the current time may be 8:30 am, and the day of the week may be Saturday. In column 1302, AF2 as a time value of 8 am and AF3 has a time value of 9:00 am, which both substantially match the current time of 8:30 am. However, AF3 has a day of week value of Saturday that matches the current day of the week. Thus, cross-correlator 304 selects AF3 as the alternate frequency because it has substantially matching time and day of week values, and because no further alternate frequency candidates exist with which to compare scores.

In another embodiment, current information 306 includes the first carrier frequency, the associated alternate frequency list, the current time, and a current weekday or weekend indication, and historical information 308 includes a historical list of transmit frequencies, one or more alternate frequencies for each of the transmit frequencies, a time value (e.g., in column 1302), a weekend/weekday value (e.g., in column 1306), and a score (e.g., in column 806) for each of the one or more alternate frequencies for each of the transmit frequencies. Cross-correlator 304 selects one or more alternate frequencies from column 804 having a time value that substantially matches the current time and weekend/weekday value that matches the current day of the week. In the current example of FIG. 13, in column 1306, WD indicates "weekday" and WE indicates "weekend." Cross-correlator 304 selects the alternate frequency having the highest score from these selected alternate frequencies. In the example of FIG. 13, the current time may be 8:30 am, and the day of the week may be Thursday, which is a weekday. In column 1302, AF2 as a time value of 8:00 am and AF3 has a time value of 9:00 am, which both substantially match the current time of 8:30 am. However, AF2 has a weekday value in column 1306 that matches the current value of weekday. Thus, cross-correlator 304 selects AF2 as the alternate frequency because it has substantially matching time and weekday values, and because no further alternate frequency candidates exist with which to compare scores.

In another embodiment, current information 306 includes the first carrier frequency, the associated alternate frequency list, and the current location for radio 400, and historical information 308 includes a historical list of transmit frequencies, one or more alternate frequencies for each of the transmit frequencies, and a location value (e.g., in column 1308) and a score (e.g., in column 806) for each of the one or more alternate frequencies for each of the transmit frequencies. Cross-correlator 304 selects one or more alternate frequencies from column 804 having a location value that substantially matches the current location. Cross-correlator 304 selects the alternate frequency having the highest score from these selected alternate frequencies. In the example of FIG. 13, the current location may be San Diego, Calif. In column 1308, AF2 has a location value of Irvine, Calif., and AF3 has a location value of San Diego, Calif. From AF2 and AF3, cross-correlator 304 selects AF3 as the alternate frequency because it has a matching location with the current location, without the need for assessing scores.

Note that the previous examples of cross-correlation of current information and historical information are provided for illustrative purposes. Further cross-correlation techniques will be apparent to persons skilled in the relevant art(s) from the teachings herein.

Example Software Embodiments

In this document, the terms "computer program medium" and "computer usable medium" are used to generally refer to media such as a removable storage unit, a hard disk installed in hard disk drive, and signals (i.e., electronic, electromagnetic, optical, or other types of signals capable of being received by a communications interface). These computer program products are means for providing software to a computer system and to storing software in a computer system or other device. The invention, in an embodiment, is directed to such computer program products.

In an embodiment where aspects of the present invention are implemented using software/firmware, the software/firmware may be stored in a computer program product and loaded into a computer system or other device using a removable storage drive, hard drive, or communications interface. The computer system or other device may execute the software/firmware from a storage such as a hard drive or memory device (e.g., a ROM device such as an electrically erasable ROM, electrically programmable ROM, a RAM device such as a static RAM, dynamic RAM, etc.). This control logic software/firmware, when executed by a processor, causes the processor to perform the functions of the invention as described herein.

According to an example embodiment, a radio may execute computer-readable instructions to generate historical information regarding alternate channel selections and/or to select alternate channels, as further described elsewhere herein, and as recited in the claims appended hereto.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method for radio signal reception in a receiver, comprising:
    configuring the receiver to receive a first modulated radio frequency (RF) signal representing a first channel having a first carrier frequency and a first coverage area;
    positioning the receiver in the first coverage area;
    receiving the first modulated RF signal and a list of alternate channels for the first channel;
    moving the receiver from the first coverage area; and
    selecting a second channel from the received list of alternate channels based on historical information regarding prior alternate channel selections, the historical information including a historical list of transmit frequencies, one or more alternate frequencies for each of the transmit frequencies, and at least one of a score, a time value, a day of week value, or a weekend/weekday value for one or more of the alternate frequencies.

2. The method of claim 1, further comprising:
    configuring the receiver to receive a second modulated RF signal representing the selected second channel having a second coverage area.

3. The method of claim 2, further comprising:
    receiving the second modulated RF signal and a second list of alternate channels for the second channel.

4. The method of claim 1, further comprising:
    updating the historical information with information regarding said selecting of the second channel.

5. The method of claim 1, wherein said receiving comprises:
    receiving the list of alternate channels in a modulated side band of the first carrier frequency.

6. The method of claim 1, wherein the first and second RF modulated signals are frequency modulated (FM) RF signals, wherein said receiving step comprises:
    receiving the first FM RF signal.

7. The method of claim 1, wherein said selecting the second channel comprises:
    cross-correlating current information with the historical information to determine the second channel from the received list of alternate channels.

8. A method for radio signal reception in a receiver, comprising:
    configuring the receiver to receive a first modulated radio frequency (RF) signal representing a first channel having a first carrier frequency and a first coverage area;
    positioning the receiver in the first coverage area;
    receiving the first modulated RF signal and a list of alternate channels for the first channel;
    moving the receiver from the first coverage area;
    selecting a second channel from the received list of alternate channels based on historical information regarding prior alternate channel selections;
    configuring the receiver to receive a second modulated RF signal representing the selected second channel having a second coverage area;
    receiving the second modulated RF signal and a second list of alternate channels for the second channel;
    receiving a program identification associated with the second channel;
    determining whether the program identification of the second channel matches a program identification of the first channel; and
    if the program identification of the second channel does not match the program identification of the first channel,
        selecting a third channel from the received list of alternate channels based on the historical information, and
        configuring the receiver to receive a third modulated RF signal representing the third channel having a third coverage area.

9. A method for radio signal reception in a receiver, comprising:
    configuring the receiver to receive a first modulated radio frequency (RF) signal representing a first channel having a first carrier frequency and a first coverage area;
    positioning the receiver in the first coverage area;
    receiving the first modulated RF signal and a list of alternate channels for the first channel;
    moving the receiver from the first coverage area;
    selecting a second channel from the received list of alternate channels based on historical information regarding prior alternate channel selections; and
    cross-correlating current information with the historical information to determine the second channel from the received list of alternate channels;
    wherein the current information includes the first carrier frequency and the received list of alternate channels, and wherein the historical information includes a historical list of transmit frequencies, one or more alternate frequencies for each of the transmit frequencies, and a score for each of the one or more alternate frequencies for each of the transmit frequencies, wherein said cross-correlating comprises:
    selecting a second carrier frequency from the historical list as an alternate frequency for a transmit frequency matching the first carrier frequency, the selected second carrier frequency being present in both the received list and the historical list, and the score of the selected second carrier frequency being a higher score relative to scores for others of the one or more alternate frequencies for the matching transmit frequency.

10. A method for radio signal reception in a receiver, comprising:
    configuring the receiver to receive a first modulated radio frequency (RF) signal representing a first channel having a first carrier frequency and a first coverage area;
    positioning the receiver in the first coverage area;
    receiving the first modulated RF signal and a list of alternate channels for the first channel;
    moving the receiver from the first coverage area;
    selecting a second channel from the received list of alternate channels based on historical information regarding prior alternate channel selections; and
    cross-correlating current information with the historical information to determine the second channel from the received list of alternate channels;
    wherein the current information includes the first carrier frequency, the received list of alternate channels, the current time, and/or geographical location, and wherein the historical information includes a historical list of transmit frequencies, one or more alternate frequencies for each of the transmit frequencies, and a time value for each of the one or more alternate frequencies for each of the transmit frequencies, wherein said cross-correlating comprises:

selecting a second carrier frequency from the historical list as an alternate frequency for a transmit frequency matching the first carrier frequency, the selected second carrier frequency being present in both the received list and the historical list, and the time value of the selected second carrier frequency matching the current time more closely than time values for others of the one or more alternate frequencies for the matching transmit frequency.

11. A method for radio signal reception in a receiver, comprising:

configuring the receiver to receive a first modulated radio frequency (RF) signal representing a first channel having a first carrier frequency and a first coverage area;

positioning the receiver in the first coverage area;

receiving the first modulated RF signal and a list of alternate channels for the first channel;

moving the receiver from the first coverage area;

selecting a second channel from the received list of alternate channels based on historical information regarding prior alternate channel selections; and cross-correlating current information with the historical information to determine the second channel from the received list of alternate channels;

wherein the current information includes the first carrier frequency, the received list of alternate channels, and the current time, and wherein the historical information includes a historical list of transmit frequencies, one or more alternate frequencies for each of the transmit frequencies, and a score and a time value for each of the one or more alternate frequencies for each of the transmit frequencies, wherein said cross-correlating comprises:

selecting a plurality of frequencies from the historical list as alternate frequencies for a transmit frequency matching the first carrier frequency, the selected plurality of frequencies being present in both the received list and the historical list and each having a time value substantially matching the current time; and selecting a second carrier frequency from the plurality of frequencies as having a higher score relative to scores for others of the plurality of frequencies.

12. A method for radio signal reception in a receiver, comprising:

configuring the receiver to receive a first modulated radio frequency (RF) signal representing a first channel having a first carrier frequency and a first coverage area;

positioning the receiver in the first coverage area;

receiving the first modulated RF signal and a list of alternate channels for the first channel;

moving the receiver from the first coverage area;

selecting a second channel from the received list of alternate channels based on historical information regarding prior alternate channel selections; and cross-correlating current information with the historical information to determine the second channel from the received list of alternate channels;

wherein the current information includes the first carrier frequency, the received list of alternate channels, the current time, and a current day of the week, and wherein the historical information includes a historical list of transmit frequencies, one or more alternate frequencies for each of the transmit frequencies, and a time value, a day of week value, and a score for each of the one or more alternate frequencies for each of the transmit frequencies, wherein said cross-correlating comprises:

selecting a plurality of frequencies from the historical list as alternate frequencies for a transmit frequency matching the first carrier frequency, the selected plurality of frequencies being present in both the received list and the historical list and each having a time value substantially matching the current time value and having a day of week value matching the current day of week; and selecting a second carrier frequency from the plurality of frequencies as having a higher score relative to scores for others of the plurality of frequencies.

13. A method for radio signal reception in a receiver, comprising:

configuring the receiver to receive a first modulated radio frequency (RF) signal representing a first channel having a first carrier frequency and a first coverage area;

positioning the receiver in the first coverage area;

receiving the first modulated RF signal and a list of alternate channels for the first channel;

moving the receiver from the first coverage area;

selecting a second channel from the received list of alternate channels based on historical information regarding prior alternate channel selections; and cross-correlating current information with the historical information to determine the second channel from the received list of alternate channels;

wherein the current information includes the first carrier frequency, the received list of alternate channels, the current time, and a current weekend/weekday, and wherein the historical information includes a historical list of transmit frequencies, one or more alternate frequencies for each of the transmit frequencies, and a time value, a weekend/weekday value, and a score for each of the one or more alternate frequencies for each of the transmit frequencies, wherein said cross-correlating comprises:

selecting a plurality of frequencies from the historical list as alternate frequencies for a transmit frequency matching the first carrier frequency, the selected plurality of frequencies being present in both the received list and the historical list and each having a time value substantially matching the current time value and having a weekend/weekday value matching the current weekend/weekday; and selecting a second carrier frequency from the plurality of frequencies as having a higher score relative to scores for others of the plurality of frequencies.

14. A method in a receiver for prioritizing radio station frequencies, comprising:

receiving in a first coverage area a first modulated RF signal representing a first channel having a first carrier frequency and a list of alternate channels for the first channel;

moving the receiver to a second coverage area;

attempting to receive a modulated RF signal in the second coverage area using at least one new channel selected from the list of alternate channels; and generating historical information regarding said attempting to receive a modulated RF signal using at least one new channel in the second coverage area;

wherein said attempting comprises:

selecting an alternate channel from the list of alternate channels;

determining whether a modulated RF signal is received using the selected alternate channel as a new channel;

selecting a next alternate channel from the list of alternate channels; and repeating said determining step using the selected next alternate channel as the new channel.

15. The method of claim 14, wherein said generating comprises:

generating a cumulative success rate of receiving a modulated RF signal for each alternate channel in the list of alternate channels used as the new channel.

16. The method of claim 14, wherein said generating comprises:

storing a record for each alternate channel used as a new channel to attempt to receive a modulated RF signal, including storing in each record the first channel, the particular alternate channel, and a score.

17. The method of claim 16, wherein said storing a record further comprises:

storing in each record an indication of at least one of a time, a day of week, or a weekday/weekend indication.

18. A method in a receiver for prioritizing radio station frequencies, comprising:

receiving in a first coverage area a first modulated RF signal representing a first channel having a first carrier frequency and a list of alternate channels for the first channel;

moving the receiver to a second coverage area;

attempting to receive a modulated RF signal in the second coverage area using at least one new channel selected from the list of alternate channels;

generating historical information regarding said attempting to receive a modulated RF signal using at least one new channel in the second coverage area;

selecting a second channel from the list of alternate channels;

receiving in the second coverage area a second modulated RF signal representing the second channel and a second list of alternate channels for the second channel;

moving the receiver to a third coverage area;

attempting to receive a modulated RF signal in the third coverage area using at least one new channel selected from the second list of alternate channels; and generating historical information regarding said attempting to receive a modulated RF signal in the third coverage area.

19. The method of claim 18, further comprising:

moving the receiver to the first coverage area;

receiving in the first coverage area the first modulated RF signal having the first carrier frequency and the first list of alternate channels for the first channel;

moving the receiver to a next coverage area;

attempting to receive a modulated RF signal in the next coverage area using at least one new channel selected from the first list of alternate channels; and generating historical information regarding said attempting to receive a modulated RF signal in the next coverage area.

20. A radio, comprising:

a receiver configured to receive a modulated radio frequency (RF) signal representing a radio channel having a selected carrier frequency, wherein the receiver is further configured to receive a list of alternate channels transmitted in a side band of the carrier frequency;

a storage that stores historical information regarding prior alternate channel selections; and a cross-correlator configured to select from the received list of alternate channels a next channel corresponding to a modulated RF signal to be received by the receiver based on the stored historical information;

wherein the historical information includes a list of records, wherein each record includes a tuned frequency, an alternate frequency, and a score.

21. The radio of claim 20, wherein the cross-correlator is configured to select a next channel for the receiver from the received list of alternate channels based on the historical information when a receive signal strength for a currently received modulated RF signal decreases below an acceptable level.

22. The radio of claim 21, wherein a location of the radio is changed to cause the receive signal strength for the currently received modulated RF signal to decrease below the acceptable level.

23. A radio, comprising:

a receiver configured to receive a modulated radio frequency (RF) signal representing a radio channel having a selected carrier frequency, wherein the receiver is further configured to receive a list of alternate channels transmitted in a side band of the carrier frequency;

a storage that stores historical information regarding prior alternate channel selections; and a cross-correlator configured to select from the received list of alternate channels a next channel corresponding to a modulated RF signal to be received by the receiver based on the stored historical information;

wherein the cross-correlator is configured to select a next channel for the receiver from the received list of alternate channels based on the historical information when a receive signal strength for a currently received modulated RF signal decreases below an acceptable level;

wherein a location of the radio is changed to cause the receive signal strength for the currently received modulated RF signal to decrease below the acceptable level; and wherein the cross-correlator is configured to cross-correlate current information with the historical information to select a next channel for the receiver from the received list of alternate channels.

24. The radio of claim 23, wherein the current information includes at least one of a current carrier frequency, a current time, a current day of the week, or a current weekend/weekday indication.

25. The radio of claim 23, wherein the historical information includes a list of records, wherein each record includes a tuned frequency, an alternate frequency, and a score.

26. The radio of claim 25, wherein each record further includes at least one of a time value, a day of the week, or a weekend/weekday.

27. A radio, comprising:

a receiver configured to receive a modulated radio frequency (RF) signal representing a radio channel having a carrier frequency, wherein the receiver is further configured to receive a list of alternate channels transmitted in a signal associated with the carrier frequency;

a historical information generator configured to generate historical information regarding attempts by the receiver to receive modulated RF signals corresponding to the alternate channels of the list;

wherein the historical information includes a list of records, wherein each record includes a tuned frequency, an alternate frequency, and a score.

* * * * *